United States Patent
Robin-Brosse et al.

(10) Patent No.: US 6,410,088 B1
(45) Date of Patent: *Jun. 25, 2002

(54) CVI (CHEMICAL VAPOR INFILTRATION) DENSIFICATION OF POROUS STRUCTURES

(75) Inventors: Christian Robin-Brosse, Le Haillan; Jacques Thebault, Bordeaux; Yves Patrigeon, Bordeaux Cauderan; Gilles Bondieu, Saint Jean D'Illac; Jean-Luc Domblides, Bruges, all of (FR)

(73) Assignee: Societe Nationale d'Etude et de Construction de Moteurs d'Aviation S.N.E.C.M.A., Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/420,428

(22) Filed: Oct. 19, 1999

(30) Foreign Application Priority Data

Oct. 20, 1998 (FR) .............................................. 98 13114

(51) Int. Cl.[7] .............................................. C23C 16/26
(52) U.S. Cl. ................................ 427/249.2; 427/249.3; 427/249.4
(58) Field of Search ............................. 427/249.2, 249.3, 427/249.6, 249.4

(56) References Cited

U.S. PATENT DOCUMENTS

| | | | | |
|---|---|---|---|---|
| 5,262,198 A | | 11/1993 | Wu et al. ................... 427/249 |
| 5,397,595 A | * | 3/1995 | Carroll et al. ............ 427/249.4 |
| 5,441,762 A | * | 8/1995 | Gray et al. ............... 427/249.2 |
| 5,547,717 A | * | 8/1996 | Scaringella et al. ........ 427/590 |
| 5,652,030 A | * | 7/1997 | Delperier et al. ......... 427/249.2 |
| 5,738,908 A | * | 4/1998 | Rey et al. ................ 427/249.2 |
| 5,871,805 A | * | 2/1999 | Lemelson ...................... 427/8 |
| 6,051,167 A | * | 4/2000 | Withers et al. ........... 427/249.2 |
| 6,083,560 A | * | 7/2000 | Fisher et al. ................ 427/249 |

FOREIGN PATENT DOCUMENTS

| | | | |
|---|---|---|---|
| FR | 2760741 | * | 9/1998 |
| WO | WO 98/40327 | | 9/1998 |

* cited by examiner

Primary Examiner—Bret Chen
(74) Attorney, Agent, or Firm—Weingarten, Schurgin, Gagnebin & Lebovici LLP

(57) ABSTRACT

The present invention provides a method of densifying porous structures by chemical vapor infiltration. In characteristic manner, said densification method is implemented using toluene as a precursor for carbon. Said toluene is generally used mixed with at least one carrier gas.

23 Claims, 3 Drawing Sheets

CVI (CHEMICAL VAPOR INFILTRATION) DENSIFICATION OF POROUS STRUCTURES

The present invention relates to CVI densification of porous structures, and more precisely to a method of densifying porous structures by chemical vapor infiltration (CVI). It provides an improvement to said prior art densification technique.

BACKGROUND OF THE INVENTION

Said densification technique in which the structure to be densified is placed in a flow of gas and the assembly is raised to a high temperature so that the pyrolytic carbon obtained by decomposition of said gas (a carbon precursor) is deposited in part in the voids within said porous structure, thereby filling said voids, at least in part, is familiar to the person skilled in the art. The carbon-precursor gases that are used most often are methane, propane, propylene, benzene, and hydrocarbons of low molecular mass. Industrial methods make use mainly of methane.

The time required for implementing conventional CVI densification is generally long. Attempts have therefore been made to implement accelerated CVI densification or to develop other densification techniques, and in particular the technique known as "densification by calefaction" (film boiling densification) in which the porous structures to be densified are kept immersed in a liquid hydrocarbon and the assembly comprising the porous structure and the liquid hydrocarbon is heated (with heating generally being implemented by inductive heating and/or resistive heating).

In the context of accelerated CVI, the temperatures and/or the pressures at which the method is implemented have been increased. Advantageous results have been obtained, but only over a relatively limited range of pressures and temperatures. The deposited pyrolytic carbon has the advantageous rough laminar texture only within said limited range of pressures and temperatures and under more severe conditions pyrolytic carbon is rapidly obtained that presents a smooth laminar structure.

OBJECTS AND SUMMARY OF THE INVENTION

According to the invention, it is recommended in CVI to make use of an original carbon precursor which, surprisingly, makes it possible to achieve a genuine acceleration of densification during which the pyrolytic carbon deposited presents a texture of the rough laminar type.

In characteristic manner, the method of the invention of densifying porous structures by chemical vapor infiltration makes use of toluene as a carbon precursor. Toluene has been found to be a precursor of particularly high performance. In the context of the method of the invention, toluene can be mixed with at least one other carbon precursor, such as propane.

The gaseous phase used when implementing the method of the invention generally contains said toluene and any other carbon precursor being used solely as a dopant, i.e. mixed with at least one carrier gas. In general, within the gaseous phase, toluene constitutes 5% to 20% by volume. Said gaseous phase can thus comprise, in a particular implementation of the densification method of the invention, 5% to 20% by volume of toluene and 80% to 95% by volume of a carrier gas or a mixture of carrier gases.

Advantageously, said carrier gas consists in natural gas (mainly constituted by methane), in hydrogen, or in an inert gas such as nitrogen.

Incidentally, it may be observed at this point that when implementing the method of the invention, it is not impossible for the carrier gas(es) used to constitute one or more carbon precursors.

The gaseous phase used in implementing the method of the invention thus generally contains said toluene mixed with at least one carrier gas and optionally at least one other carbon precursor gas.

Nevertheless, in the ambit of the invention, it is not impossible to perform CVI with a gaseous phase that is essentially constituted by toluene (comprising almost 100% or indeed exactly 100% toluene) or with a gas constituted by toluene and at least one other carbon precursor.

Surprisingly, the Applicant has discovered the numerous advantages that can arise by using toluene as a carbon precursor in a method of densification by means of chemical vapor infiltration (CVI).

Said precursor makes it possible, in particular, to achieve rates of densification that are higher than those achieved under the same conditions of temperature and pressure when using prior art precursors such as cyclohexane, hexane, propylene, or propane. Said precursor generates dense pyrolytic carbon. Specifically, the Applicant has obtained pyrolytic carbons of relative density lying in the range 2.10 to 2.15. The method of the invention is particularly advantageous in that:

- with toluene, there is a very wide range over which the deposited pyrolytic carbon has a rough laminar texture, thus making it possible to use deposition speeds that are high (e.g. a mass gain of more than 100% over 25 hours for needled fiber preforms that are 17 mm thick), whereas smooth laminar pyrolytic carbon is rapidly produced when using propane at deposition speeds that are as fast; and
- with toluene, the deposited rough laminar pyrolytic carbon texture is homogenous throughout the thickness of the deposit. When using propane as in the prior art, smooth laminar pyrolytic carbon is always present on the surface, which means that it must be removed by machining after performing the densification method.

The person skilled in the art will already have understood the advantage of using toluene in accordance with the invention, particularly for the purpose of directly obtaining thin parts which can thus be densified quickly to their final shape (such parts can be obtained "near net shape (NNS)" which is not possible with presently known CVI densification methods unless the structure of the deposited pyrolytic carbon can be ignored).

The Applicant has performed numerous tests, in particular comparative tests, to support the above assertions. The results of some of said tests are described in greater detail in the present specification with reference to the accompanying figures.

The method of the invention can be implemented to densify any type of porous substrate by CVI, and in particular to densify fiber preforms. It is particularly recommended to use the invention for preparing carbon-carbon (C/C) composites; i.e. for densifying fiber preforms that are based on carbon fibers.

The method of the invention, a prior art chemical vapor infiltration method as implemented in novel manner according to the invention by using toluene as a carbon precursor, can be implemented in all of the conventional manners used for implementing CVI, i.e. constant temperature, constant pressure, or with a temperature gradient, in particular by direct coupling.

DESCRIPTION OF THE DRAWINGS

The invention is described below setting out its advantages with reference to the accompanying figures.

gas pressure 1.3 kPa;

temperatures respectively of 980° C., 1015° C., 1050° C.; and duration of infiltration 25 hours; with the gaseous phase being doped in various different ways, the dopants occupying 20% by volume relative to 80% by volume of methane.

On each occasion, the results obtained in the densified preform are given for three measurements, respectively for densification performed at the top, in the middle, and at the bottom of the densification furnace.

Figure 1:
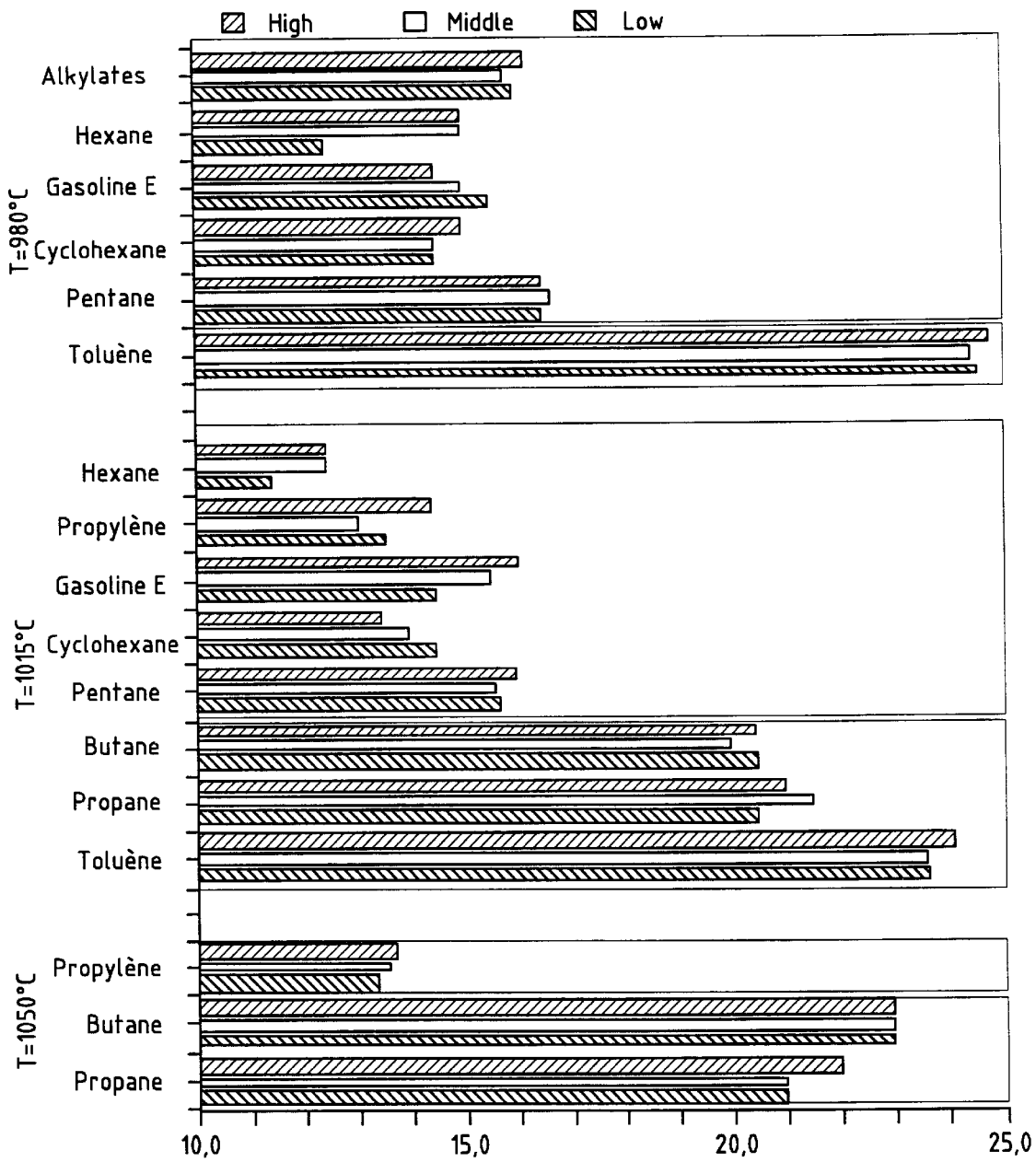
FIG. 1 shows the results obtained concerning Maltese Cross extinction angles as determined using a polarized light optical microscope (concerning variation in the optical anisotropy of the deposited pyrolytic carbon) for fiber preforms densified in accordance with the invention and with the prior art, under the following conditions.

The results given in FIG. 1 show that the pyrolytic carbon obtained at the end of implementing the method of the invention is a pyrolytic carbon having very high optical anisotropy (to be classified as a rough laminar pyrolytic carbon on the scale drawn up on the basis of Maltese Cross extinction angles).

Figures 2A, 2B:
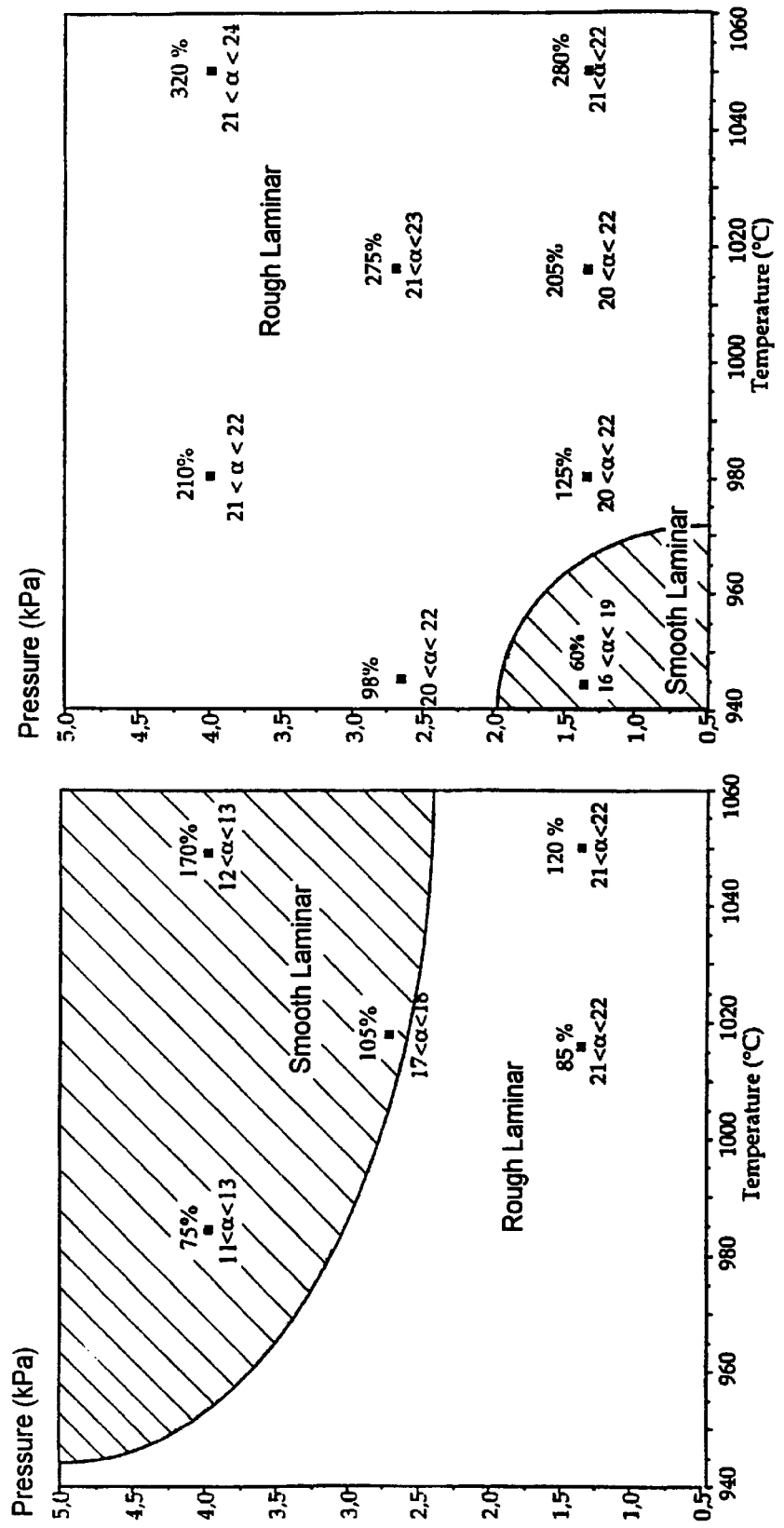

FIGS. 2A and 2B show the results (in the form of charts of pressure as a function of temperature) of comparative studies of the same type. More precisely, the texture of the resulting pyrolytic carbon is given, together with the infiltration rates (expressed as a percentage of deposited pyrolytic carbon relative to fiber preform mass), and Maltese Cross extinction angles ($\alpha$), as a function of infiltration conditions.

To obtain the results shown in FIGS. 2A and 2B, the infiltration method was implemented for 25 hours using fiber preforms that were 17 mm thick, under various conditions of temperature and pressure, and using a gaseous phase constituted:

in accordance with the prior art: by 80% methane and 20% propane (volume percentage) (FIG. 2A);

in accordance with the invention: 80% methane and 20% toluene (volume percentage) (FIG. 2B). FIG. 2A shows very clearly the limits on accelerating densification in the prior art. The range in which rough laminar pyrolytic carbon is obtained is narrow.

Figure 3A:
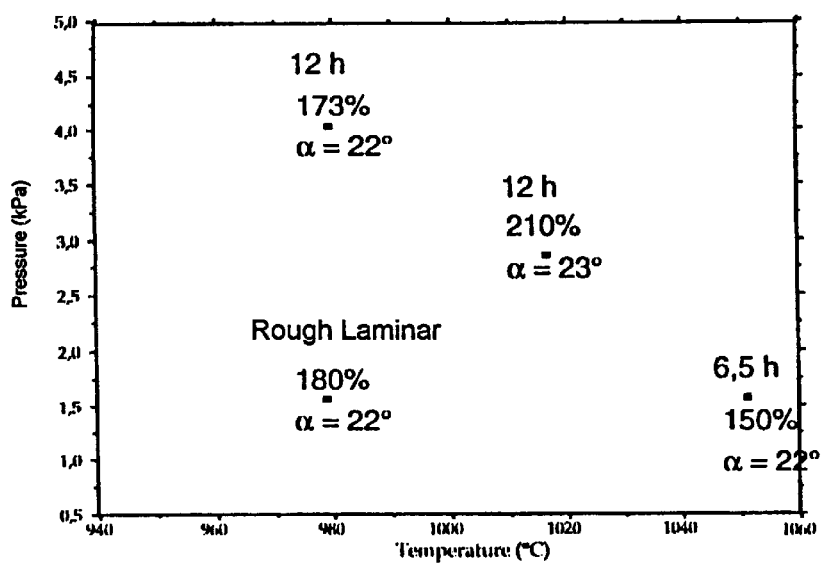
Figure 3B:
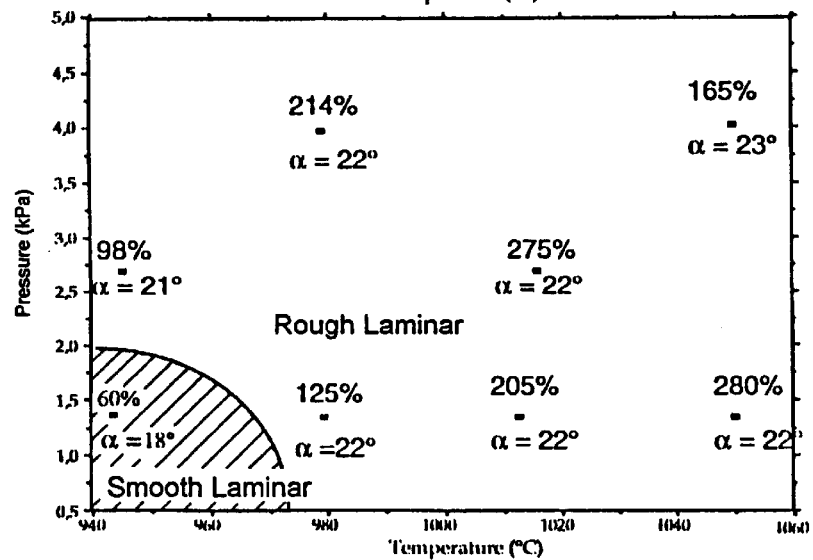
Figure 3C:
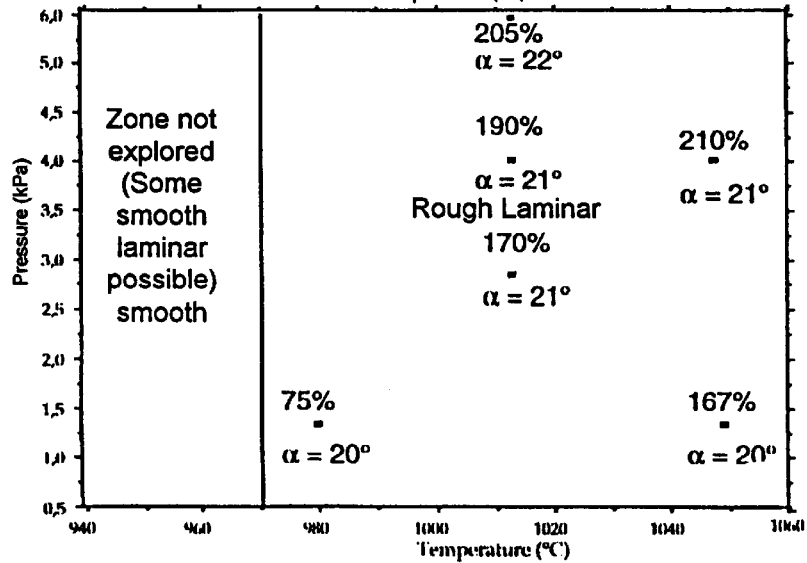

FIGS. 3A, 3B, and 3C show the influence of the percentage of toluene in the gas on the texture of the resulting pyrolytic carbon. The percentages given correspond to the relative mass gain of the densified preforms; the values given for 60 correspond to the mean extinction angles determined using an optical microscope with polarized light. The results given were obtained using fiber preforms that were 17 mm thick, and that were subjected to infiltration for 25 hours; the toluene was mixed with the methane as follows:

50% by volume for the results given in FIG. 3A;

20% by volume for the results given in FIG. 3B; and

10% by volume for the results given in FIG. 3C.

The person skilled in the art will observe with interest the large ranges in FIGS. 2B, 3A, 3B, and 3C within which pyrolytic carbon is obtained that has a rough laminar texture.

What is claimed is:

1. A method of densifying porous structures by chemical vapor infiltration, wherein said porous structures are surrounded by a vapor containing toluene as a precursor for carbon, said toluene optionally mixed with at least one other precursor for carbon.

2. The method according to claim 1, wherein said vapor contains at least one carrier gas in addition to said carbon precursor(s).

3. The method according to claim 2, wherein said vapor contains 5% to 20% by volume of toluene.

4. The method according to claim 3, wherein said carrier gas comprises a gas selected from the group consisting of natural gas, hydrogen, and an inert gas.

5. The method according to claim 3, wherein said porous structures are fiber preforms.

6. The method according to claim 3, wherein said chemical vapor infiltration is implemented with conditions chosen from the group of at constant temperature across said porous structure, at constant pressure and with a temperature gradient across said porous structure.

7. The method of claim 6 wherein said chemical vapor infiltration is implemented by direct coupling.

8. The method according to claim 2 wherein said carrier gas comprises a gas selected from the group consisting of natural gas, hydrogen, and an inert gas.

9. The method of claim 8 wherein said inert gas comprises nitrogen.

10. The method according to claim 1, wherein said vapor consists essentially of toluene.

11. The method according to claim 10, wherein said porous structures are fiber preforms.

12. The method according to claim 10, wherein said chemical vapor infiltration is implemented with conditions chosen from the group of at constant temperature across said porous structure, at constant pressure and with a temperature gradient across said porous structure.

13. The method of claim 12 wherein said chemical vapor infiltration is implemented by direct coupling.

14. The method according to claim 1, wherein said porous structures are fiber preforms.

15. The method according to claim 1, wherein said chemical vapor infiltration is implemented with conditions chosen from the group of at constant temperature across said porous structure, at constant pressure and with a temperature gradient across said porous structure.

16. The method of claim 15 wherein said chemical vapor infiltration is implemented by direct coupling.

17. A method for preparing carbon-carbon composites by densification of carbon fiber preforms by chemical vapor infiltration, wherein said carbon fiber preforms are surrounded by a vapor containing toluene as a precursor for carbon, said toluene optionally mixed with at least one other precursor for carbon.

18. The method according to claim 17, the method being implemented for preparing carbon-carbon composites wherein said vapor contains at least one carrier gas in addition to said carbon precursor(s) and said vapor contains 5% to 20% by volume by toluene.

19. The method according to claim 17, wherein said vapor consists essentially of toluene.

20. A method according to claim 19, wherein said chemical vapor infiltration is implemented with conditions chosen from the group of at constant temperature across said porous structure, at constant pressure and with a temperature gradient across said porous structure.

21. The method of claim 20 wherein said chemical vapor infiltration is implemented by direct coupling.

22. In a method of densifying porous structures by chemical vapor infiltration, carried out at a pressure between 0.5 and 5 kPa with a process gas surrounding said porous structures, the improvement which consists of using gaseous toluene as a precursor of pyrolytic carbon in said method, said toluene being optionally mixed with at least one other gaseous precursor of pyrolytic carbon so as to optimize the speed of deposit of pyrolytic carbon that is homogeneous, dense and exhibits a high proportion of deposit with a rough laminar structure.

23. In a method for preparing carbon—carbon composites by densification of carbon fiber preforms by chemical vapor infiltration, carried out at a pressure between 0.5 and 5 kpa with a process gas surrounding said carbon fiber preforms, the improvement which consists of using gaseous toluene as a precursor for pyrolytic carbon in said method, said toluene being optionally mixed with at least one other gaseous precursor for carbon wherein the deposit of homogeneous dense pyrolytic carbon with a rough laminar structure is optimized for speed of deposit.

* * * * *

UNITED STATES PATENT AND TRADEMARK OFFICE
CERTIFICATE OF CORRECTION

PATENT NO.    : 6,410,088 B1
DATED         : June 25, 2002
INVENTOR(S)   : Christian Robin-Brosse et al.

It is certified that error appears in the above-identified patent and that said Letters Patent is hereby corrected as shown below:

Column 3,
Line 52, "60" should read -- α --; and

Column 4,
Lines 52-53, delete "the method being implemented for preparing carbon-carbon composites".

Signed and Sealed this

Thirtieth Day of September, 2003

JAMES E. ROGAN
*Director of the United States Patent and Trademark Office*